United States Patent [19]

Wheeler

[11] Patent Number: 5,508,938
[45] Date of Patent: Apr. 16, 1996

[54] SPECIAL INTERCONNECT LAYER EMPLOYING OFFSET TRACE LAYOUT FOR ADVANCED MULTI-CHIP MODULE PACKAGES

[75] Inventor: Richard L. Wheeler, San Jose, Calif.

[73] Assignee: Fujitsu Limited, Japan

[21] Appl. No.: 125,035

[22] Filed: Sep. 21, 1993

Related U.S. Application Data

[63] Continuation-in-part of Ser. No. 929,721, Aug. 13, 1992, abandoned.

[51] Int. Cl.$^6$ .............................. G06F 15/00; H01L 23/48
[52] U.S. Cl. ........................ 364/488; 364/491; 437/195; 257/700
[58] Field of Search ................... 364/488, 489, 364/490, 491; 257/684, 685, 700, 758; 29/846, 847; 437/180, 189, 195; 307/409

[56] References Cited

U.S. PATENT DOCUMENTS

| | | |
|---|---|---|
| 4,210,885 | 7/1980 | Ho . |
| 4,245,273 | 1/1981 | Feinberg et al. ................ 361/382 |
| 4,553,111 | 11/1985 | Barrow ............................. 333/1 |
| 4,560,962 | 12/1985 | Barrow . |
| 4,802,062 | 1/1989 | Blum et al. . |
| 4,811,082 | 3/1989 | Jacobs et al. ..................... 257/700 |
| 4,859,806 | 8/1989 | Smith ............................ 29/847 |
| 4,930,002 | 5/1990 | Takenaka et al. ............... 257/697 |
| 4,989,062 | 1/1991 | Takahashi et al. . |
| 5,008,728 | 4/1991 | Yamamura et al. . |
| 5,029,279 | 7/1991 | Sasaki et al. . |
| 5,045,819 | 9/1991 | Balanis et al. . |
| 5,060,045 | 10/1991 | Owada et al. . |
| 5,060,116 | 10/1991 | Grobman et al. . |
| 5,061,824 | 10/1991 | Alexander et al. . |
| 5,068,631 | 11/1991 | Vince . |
| 5,079,717 | 1/1992 | Miwa . |
| 5,081,563 | 1/1992 | Feng et al. ................. 361/414 |
| 5,127,986 | 7/1992 | August et al. ................ 427/98 |
| 5,165,166 | 11/1992 | Carey .......................... 29/847 |
| 5,332,923 | 7/1994 | Takeuchi ..................... 257/758 |
| 5,377,124 | 12/1994 | Mohsen ....................... 364/489 |
| 5,391,921 | 2/1995 | Kudoh et al. ................ 257/758 |

FOREIGN PATENT DOCUMENTS

| | | |
|---|---|---|
| 0026807 | 4/1981 | European Pat. Off. . |
| 0166289 | 1/1986 | European Pat. Off. . |
| 0558984 | 9/1993 | European Pat. Off. . |
| 2563656 | 10/1985 | France . |
| 2567684 | 1/1986 | France . |
| 4021965 | 1/1991 | Germany . |
| 58-124260 | 7/1983 | Japan . |

OTHER PUBLICATIONS

John L. Sprague, "Multilayer Ceramic Packaging Alternatives", IEEE Transactions, on Components, Hybrids, and Manufacturing Tech., vol. 13, No. 2, Jun., 1990, pp. 390–396.

EPIH (Electronic Packaging and Interconnection Handbook), Chap. 11, Packaging of High–Speed Digital Systems, p. 11.55, p. 11.9 Critical Signals.

Primary Examiner—Kevin J. Teska
Assistant Examiner—Tan Q. Nguyen
Attorney, Agent, or Firm—Christie, Parker & Hale

[57] ABSTRACT

A multi-layer printed wiring board design method employs establishing of critical and non-critical signal layers with first and second design rule sets assigned respectively. A configuration employing y x y' layers wherein conductors in the y and y' layers are orthogonal to x layers and y' layers are offset by approximately one-half pitch from y layers for cross talk reduction.

8 Claims, 3 Drawing Sheets

SPECIAL INTERCONNECT LAYER EMPLOYING OFFSET TRACE LAYOUT FOR ADVANCED MULTI-CHIP MODULE PACKAGES

CROSS-REFERENCE TO RELATED APPLICATION

This is a continuation-in-part of application Ser. No. 07/929,721, filed Aug. 13, 1992, now abandoned.

BACKGROUND OF THE INVENTION

1. Field of the Invention

The present invention relates generally to the field of printed wiring boards for Multi-Chip Module (MCM) systems for the attachment of and signal distribution between multiple integrated circuit chips. In particular, the present invention provides distinct signal planes having mechanical and electrical characteristics that differ from alternate signal planes based on requirements of the signals to be carried in the plane.

2. Prior Art

Mounting and interconnection of modern integrated circuits is typically accomplished through the use of Printed Wiring Boards (PWB). The connection of numerous chips in modern MCM systems for high performance computers requires multi-layer PWBs and the technological requirements for increased chip density, higher signal frequencies, and increased design complexity places high demands on PWB design techniques and manufacturing processes. The desired capabilities of PWBs are low resistance, constant transmission line impedance, high density of conductors, low cross-talk between conductors, high propagation velocity, low signal timing skew between multiple paths, ability to terminate lines in a characteristic impedance, and engineering change capability.

Development of a PWB requires engineering trades between the desired characteristics. Simultaneously achieving the desired characteristics is difficult. Low resistance and low cross-talk are incompatible with high density of conductors. Similarly, desire for high propagation velocity in combination with high density necessarily reduces the capability to perform engineering changes without redesign of PWB layers.

Various manufacturing and design techniques for multi-layer PWBs exist. Stripline and microstrip technologies are used singlely or combination in multi-layer PWBs for control of cross-talk and impedance. Buried microstrip technology and dual stripline technology are exemplary of improvements in the art to further refine basic design capabilities for multi-layer PWBs.

The complex routing of conductors in the various layers and between layers, and the extremely high density necessary in modern PWBs typically requires the use Computer Aided Design (CAD) systems for generation of the PWB layouts. CAD systems employing gridded design and gridless design have been employed for modern designs. Gridded systems require placement of conductors on a given grid spacing while allowing differing conductor width. Gridless systems typically employ a fixed separation of conductors while similarly allowing varying conductor widths. Present CAD systems employ identical mechanical and electrical characteristics such as pitch of the conductors and impedance for a given PWB layout. Design compromises for allowing all types of signals such as data, clock signals, and control signals, whether synchronous or asynchronous, are made to allow the signals to be carried in the signal planes. Consequently, an over design condition exists for many signals in order to accommodate requirements of asynchronous signals or clock signals for reduced cross-talk to avoid false triggering of these critical signals.

Arrangement on multi-layer printed circuit boards typically employs two layers between adjacent power or ground planes. These signal layers are arranged in a perpendicular relationship typically identified as "xy" to minimize cross-talk between the "x" and "y" layer based on the small overlap area between the "x" and "y" conductors. Additional layering intermediate adjacent power or ground planes has been accomplished in the prior art by addition of layers oriented at ±45° with respect to the "x" and "y" layers (typically known as "r" and "s" layers). Cross-talk is again minimized between all layers; "r", "s", "x" and "y" because of small area overlap.

These layer orientations, while minimizing cross-talk, do not provide sufficient flexibility in modern design scenarios.

SUMMARY OF THE INVENTION

The present invention eliminates the inefficiencies of over-design required by the prior art design techniques for PWBs. For implementation of the present invention, signals are categorized based on criticality and sensitivity to cross-talk and line resistance. A first signal plane having a first conductor pitch and dielectric thickness is provided for critical signals. A second signal plane having a conductor density of approximately a factor of four greater than the first signal plane and reduced dielectric thickness is provided for non-critical signals.

CAD design of the first signal plane and second signal plane is implemented by employing separate design rules for the two planes as opposed to common design rules for all signal planes in the PWB.

Signals employed in the MCM are categorized based on the nature and sensitivity of the signals. Clock signals, control signals, asynchronous signals, and signals requiring transmission over a significant distance are exemplary of critical signals combined in a first category. Signals having a short transmission length and low sensitivity to cross-talk which can accommodate a conductor density of at least a factor of four over the critical signals are categorized in a second category as non-critical signals.

Design rules for the first category of critical signals are defined to require low resistance and low noise or cross-talk to establish the mechanical and electrical characteristics of the first signal plane. Design rules for the non-critical signals allow narrow traces with narrow separation for maximum conductor density over short length runs. Additional design criteria, including limiting vias to adjacent planes only and requiring chip resident series termination further establish design rules for the non-critical signal planes to achieve maximum density. Design rules employed for the first and second signal planes are then implemented for a plurality of mixed planes having characteristics of the first signal plane and second signal plane.

Additional density in an MCM is provided in the present invention by employing at least three signal layers, intermediate the ground or power planes, oriented in a "y-x-y'" arrangement wherein in the "y" and "y'" layers are perpendicular to the "x" layer and the "y" and "y'" layers are offset by approximately one-half pitch. The "y-x-y'" arrangement of layers intermediate the ground or power planes provides for maximum density with reduced cross-talk between layers.

The present invention provides the capability to design high density MCM systems with greater miniaturization while maintaining signal integrity and adapting available design processes for cost effective implementation.

DETAILED DESCRIPTION OF THE INVENTION

Figure 1:
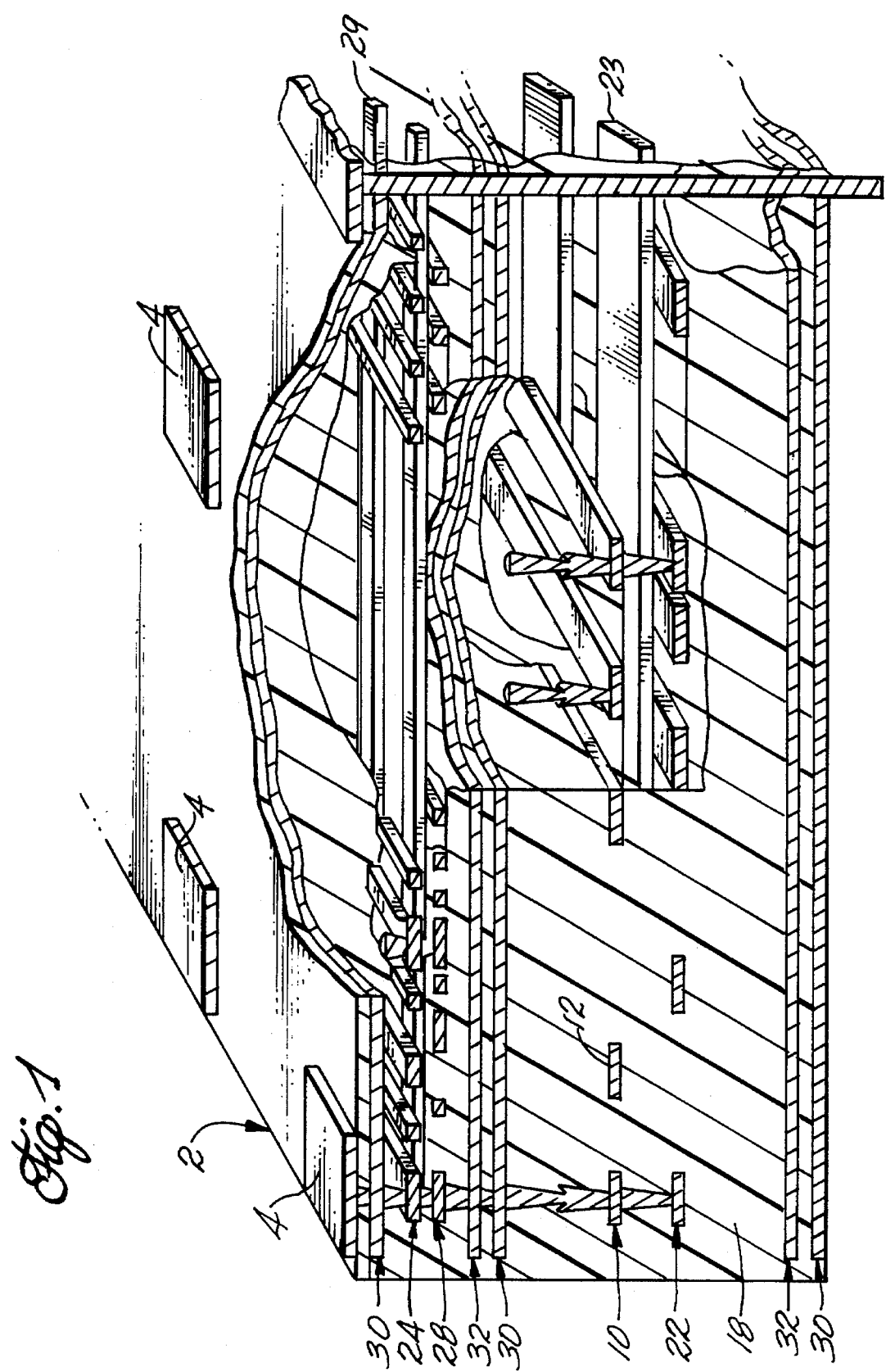
FIG. 1 is a pictorial cutaway sectional view of a multi-chip module PWB demonstrating multiple signal planes having a first pitch with low density for critical signals and multiple signal planes having a second pitch with higher density for non-critical signals, the multiple signal planes of both first and second pitch having a "y-x-y'" orientation for reduced cross-talk.
Figure 2:
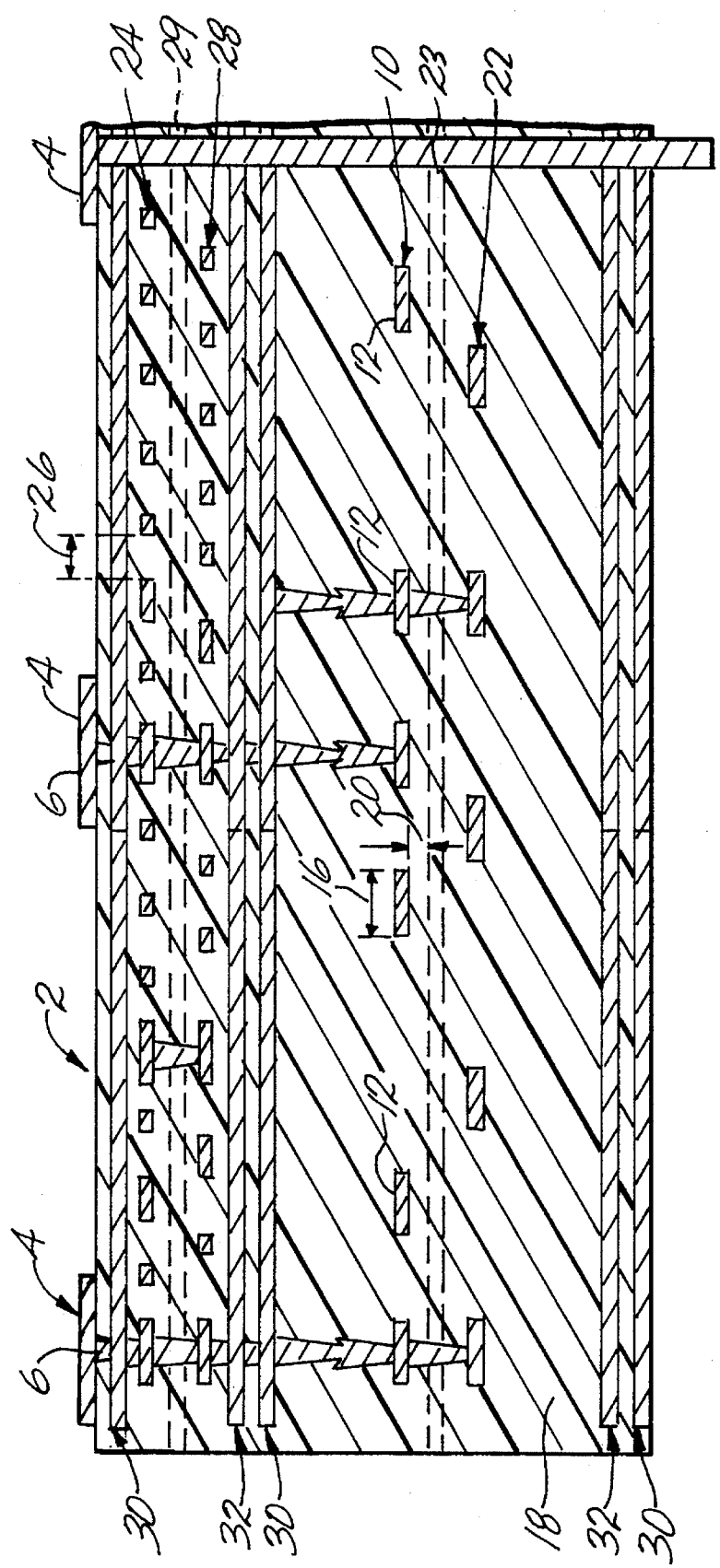
FIG. 2 is a end section view of the PWB signal planes.

Turning to the drawings, an embodiment of the present invention in a multi-layer PWB. A multi-layer PWB 2 incorporates IC mounting pads 4 to receive VLSI chips. Conducting vias 6 connect the pads to conductors in signal planes interconnecting the various chips in an MCM system. As best seen in FIG. 2, a first signal plane generally designated 10 comprises conductors 12 having a minimum pitch 14 and a conductor width 16. The width and pitch of the conductors in the first signal plane is established, based on design requirements for spacing determined by analyzing the requirements for a first group of signals designated critical signals. Critical signals include clock signals, control signals, signals requiring transmission over an extended distance on the PWB, asynchronous signals, and signals for which engineering changes are anticipated. The conductor width is established to provide low resistance for the critical signals and the pitch is defined to provide minimal cross-talk to avoid false triggering. The dielectric 18 has a minimum width 20 between signal planes for the critical signal plane 10. As shown in the drawings, signal planes exemplified by signal planes 22 and 23, employ common design characteristics with the first signal plane for critical signal routing.

The three signal planes 10, 22 and 23 are arranged with the first plane 10 at a 0° orientation, the adjacent plane 23 at 90° and the third plane 22 at 0° but offset by approximately one-half pitch from the first plane 10. In modern VLSI, interconnection is bus oriented favoring one direction on certain parts of the board. Higher density interconnect is obtained by running two sets of signal traces in one direction and one set of signal traces at right angles to the first. The two sets of wires that run in the same direction are placed adjacent the ground planes, while the single intermediate set is rotated 90° to the first. This can be described as an "x-y-x" or "y-x-y" orientation. The cross-talk between wires in any plane is dictated by the relatively large spacing between the wires. The cross-talk between the first and second layer or second and third layer is reduced because the signals are at right angles to one another and therefore have a small area of overlap.

Figure 3B:
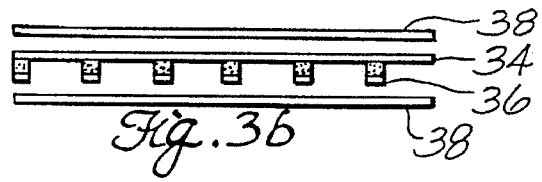
FIGS. 3a and 3b are top and section views of prior art two-layer signal plane technology employing "x-y" orientation.
Figure 3A:
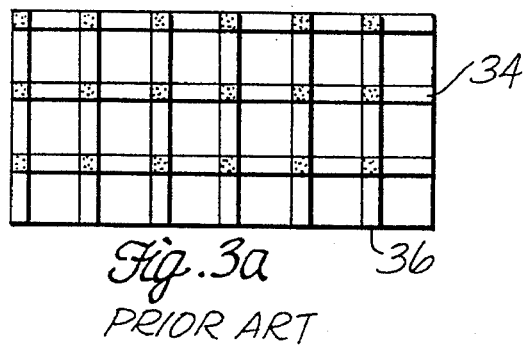
Figure 4B:
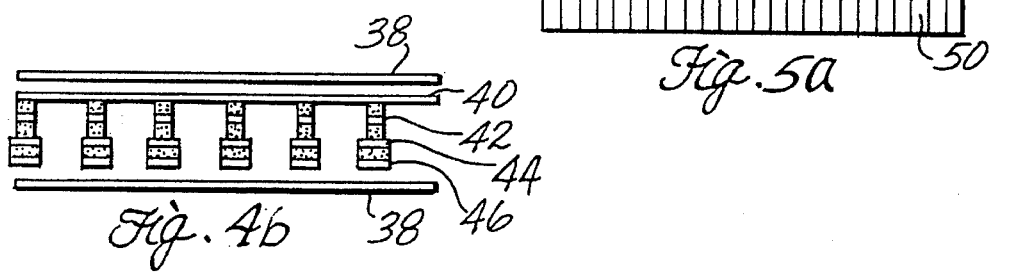
FIGS. 4a and 4b are top and section views illustrating the prior art employing four signal layers having "x-y-r-s" orientation wherein the "x" and "y" layers are placed at 0° and 90° while the "r" and "s" layers are oriented at ±45°.
Figure 4A:
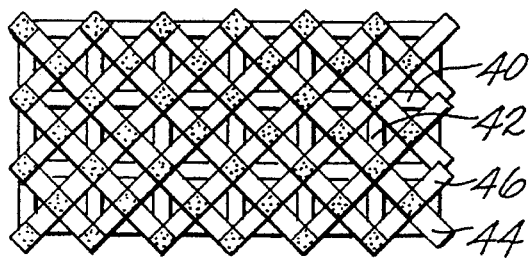

Prior art technologies provided for "x-y" orientations of signal planes intermediate ground or power planes with the "x" and "y" layers oriented at 90°. This prior art configuration is shown in FIGS. 3a and 3b. The top view FIG. 3a of the "x-y" approach demonstrates the very small overlap area of the wires in the two signal planes which is represented in section in FIG. 3b. A more sophisticated prior art technique is shown in FIGS. 4a and 4b, which is known in the "x-y-r-s" approach, wherein the "x" layer 40 is oriented at 0° while the "y" layer 42 is oriented at 90°. The "r" layer 44 is oriented at −45° while the "s" layer 46 is oriented at +45°. All four layers are placed intermediate ground planes 38 in this arrangement. Again, the shaded overlap area best seen in the top view of FIG. 4a represents the small cross-talk area also shown in the sectional view of FIG. 4b.

Figure 5B:
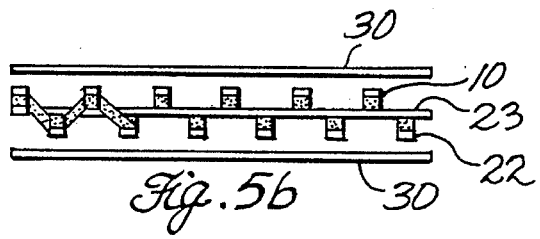
FIGS. 5a and 5b are top and section views illustrating the present invention employing a "y-x-y'" signal layer arrangement schematically demonstrating the cross-talk areas and distances for the various layers wherein the "y" and "x" layers are oriented at 90° and the "y'" layer is offset one-half pitch from the "y" layer.
Figure 5A:
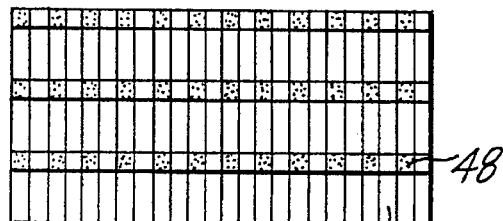

In the present invention, the cross-talk between wires in the "y" layer 10 and the "x" layer 23 is minimized based on the perpendicular orientation of those two layers. Similarly, cross-talk between the "x" layer 23 and the "y'" layer 22 is minimized based on similar perpendicular orientation. Cross-talk between the "y" layer 10 and the "y'" layer 23 is minimized by placing the wires in an offset of approximately one-half pitch. Additional reduction in cross-talk is accomplished based on greater spacing between wires in the "y" and "y'" layers due to the combination of the distance created by the intermediate layer and offset pitch. As best seen in the top view FIG. 5a, the cross-talk overlap between the "y" and "x" and "x" and "y'" layers shown by first shading 48 and the cross-talk area between "y" and "y'" layers denoted by second shading 50 is minimal. Cross-talk between the "y" and "y'" layers will be comparable to cross-talk between wires within the same signal plane. The "y-x-y'" orientation allows maximum asymmetric connectivity with a minimum number of layers.

A second signal plane generally designated 24 is provided with minimum conductor spacing 26 and variable conductor widths based on design rules established for non-critical signals. Non-critical signals include data buses and other signals less susceptible to cross-talk or false triggering and routed for only short lengths. Typically, a one to two chip crossing is established as a maximum for conductors in the second signal plane. The conductors in the second signal plane employ narrow traces, typically 5 μm, with relatively narrow separation of the conductors of 5 to 20 μm. Density of conductors in the second signal plane is established at approximately four times the density of the first signal plane as determined by system requirements. A design requirement for series termination residing in the VLSI chip connected to conductors in the second signal plane eliminates requirements for termination resisters or similar means which would require a reduction in density for physical connection. A design rule establishing vias only between adjacent planes further avoids any requirement for density reduction. The design rules on the second signal plane allow relatively high cross-talk and have relatively high conductor resistance based on trace dimensions. The limitations on conductor length and depth of vias precludes significant impact on signal quality. Signal planes employing the design rules for the second signal plane exemplified by the planes generally designated 28 and 29 oriented in a "y-x-y'" relationship with the second signal plane 24 as previously described for signal planes 10, 22 and 23, are present in the PWB.

Engineering changes are accommodated in the first signal plane and signal planes employing the design rules for the first signal plane. The pitch and conductor size employed is designed to accommodate jumper wiring between conductors and disconnection of conductors using mechanical severing, laser vaporization, or other standard means.

The embodiment of the PWB shown in the drawings incorporates dual stripline technology having power and ground planes 30 and 32 separating "y-x-y" groupings of signal planes. The present invention is equally applicable to embodiments employing buried microstrip applications or combined applications.

Establishing design rules for the first signal plane and second signal plane requires separation of signals into designated categories as critical signals or non-critical signals. Determination of worst case requirements for critical signals establishes the design parameters for conductor dimensions, conductor pitch or spacing, and dielectric thickness between adjacent signal planes. Standard CAD systems are employed for routing of the first signal plane and signal planes having identical characteristic requirements.

Similarly, design rules are established for the non-critical signals and standard CAD systems are employed to provide routing of the second signal plane and planes having identical signal characteristics. While two signal plane types have been demonstrated in the embodiments shown in the drawings, the present invention is applicable to a plurality of signal plane types having varying conductor densities and mechanical and electrical properties to accommodate a plurality of signal groupings having various levels of criticality and the associated design requirements imposed upon the signal planes carrying the signal group.

The present invention provides for high density signal planes for signal nets of non-critical signals which comprise 70–80% of interconnections in modern MCM systems. The remaining critical signals are accommodated in signal planes incorporating design rules sufficient to preclude signal degradation. The combined conductor density provided by the present invention for the overall PWB for the MCM system is significantly enhanced over prior art systems employing a single design criteria for all signal planes based on critical signal requirements.

Orientation of the "y-x-y'" groupings of signal planes may be varied between the groups of signal planes employing various design rules based on the favored direction for bus interconnection for those conductors. The combination of "y-x-y'" orientation with multiple design rules for critical signal planes and high density non-critical signal planes allows maximum density in the overall PWB for the MCM system.

Having now described the invention in detail, as required by the Patent Statutes those skilled in the art will recognize modifications and substitutions to the embodiments disclosed herein for specific applications. Such modifications and substitutions are within the scope and intent of the present invention as defined in the following claims.

What is claimed is:

1. A method for multi-layer printed wiring board design comprising the steps of:

establishing a first category of critical signals;

defining design rules for first conductor spacing and first conductor characteristics to reduce degradation of the critical signals;

identifying a favored direction for bus interconnection;

defining a first orientation of adjacent signal planes to employ the first design rules having at least one "y" plane oriented at 0° relative to the favored direction, at least one "x" plane separated from said y plane by a dielectric layer having conductors oriented at 90° to the favored direction and at least one "y'" plane separated from said x plane by a dielectric layer having conductors oriented at 0° with respect to the favored direction, said conductors of the "y'" plane offset from the conductors of the "y" plane by approximately one-half pitch;

laying out at least one plurality of first signal planes using the first design rules and first orientation;

establishing a second category of non-critical signals, defining second design rules for second conductor spacing and second conductor characteristics for said non-critical signals; and laying out at least one plurality of second signal planes employing the second design rules.

2. A method as defined in claim 1 further comprising the steps of:

identifying a second favored direction for bus interconnection;

defining a second orientation of adjacent signal planes to employ the second design rules having at least one second "y" plane oriented at 0° relative to the favored direction, at least one second "x" plane having conductors oriented at 90° to the favored direction and at least one second "y'" plane having conductors oriented at 0° with respect to the favored direction, said conductors of the second "y'" plane offset from the conductors of the second "y" plane by approximately one-half pitch; and wherein said step of laying out at least one plurality of second signal planes employs said second orientation.

3. A method as defined in claim 1 wherein the step of establishing the first category of critical signals includes:

selecting clock signals;

selecting control signals; and selecting asynchronous signals.

4. A method as defined in claim 3 wherein the step of establishing critical signals further includes selecting signals requiring vias of greater than one layer.

5. A method as defined in claim 3 wherein the step of selecting critical signals further includes selecting signals having a path extending beyond two chips in length.

6. A method as defined in claim 1 wherein the step of defining second design rules further comprises determining second conductor spacing and second conductor characteristics to establish a conductor density of at least a factor of four greater than the density established by the first conductor spacing and first conductor characteristics.

7. A method as defined in claim 3 wherein the step of establishing critical signals includes selecting signals potentially requiring engineering changes.

8. A method as defined in claim 3 wherein the step of establishing critical signals includes selecting signals requiring off-chip termination.

* * * * *

UNITED STATES PATENT AND TRADEMARK OFFICE
CERTIFICATE OF CORRECTION

PATENT NO. : 5,508,938
DATED : April 16, 1996
INVENTOR(S) : Richard L. Wheeler

It is certified that error appears in the above-indentified patent and that said Letters Patent is hereby corrected as shown below:

```
Column 1, line 48, change "singlely" to  -- singly --.
Column 3, line 17, before "end" change "a" to -- an --.
Column 3, line 37, after "invention" replace "in" with
                  -- is --
Column 4, line 57, change "resisters"  to -- registors --.
Column 5, line 12, change "y-x-y" to -- "y-x-y'" --.
Column 6, line 8, before "plane" change y to -- "y" --.
Column 6, line 11, before "plane" change x to -- "x" --.
```

Signed and Sealed this

Eighth Day of October, 1996

*Attest:*

BRUCE LEHMAN

*Attesting Officer*   Commissioner of Patents and Trademarks